(12) United States Patent
Kim

(10) Patent No.: US 8,416,634 B2
(45) Date of Patent: Apr. 9, 2013

(54) SEMICONDUCTOR MEMORY DEVICE

(75) Inventor: Je-Yoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 188 days.

(21) Appl. No.: 12/980,616

(22) Filed: Dec. 29, 2010

(65) Prior Publication Data
US 2011/0267900 A1    Nov. 3, 2011

(30) Foreign Application Priority Data

Apr. 30, 2010  (KR) .................. 10-2010-0040627

(51) Int. Cl.
*G11C 7/00* (2006.01)

(52) U.S. Cl.
USPC ............ 365/189.11; 365/189.07; 365/189.09; 365/189.08; 365/236

(58) Field of Classification Search ............. 365/189.11, 365/189.07, 189.08, 189.09, 236
See application file for complete search history.

(56) References Cited

U.S. PATENT DOCUMENTS

2009/0002018 A1    1/2009  Jeong et al.
2010/0308861 A1*  12/2010  Lee .................................. 326/30

OTHER PUBLICATIONS

Notice of Preliminary Rejection issued from Korean Intellectual Property Office on May 4, 2011.

* cited by examiner

*Primary Examiner* — Thong Q Le
(74) *Attorney, Agent, or Firm* — IP & T Group LLP

(57) ABSTRACT

A semiconductor memory device includes a pad, an impedance calibration circuit configured to provide a first code value corresponding to an impedance value coupled to the pad, a PVT sensing control circuit configured to provide a second code value corresponding to a PVT variation, and an output driver configured to receive data and to pull up or pull down the pad in response to the first code value and second code value.

14 Claims, 8 Drawing Sheets

SEMICONDUCTOR MEMORY DEVICE

CROSS-REFERENCE TO RELATED APPLICATIONS

The present application claims priority of Korean Patent Application No. 10-2010-0040627, filed on Apr. 30, 2010, which is incorporated herein by reference in its entirety.

BACKGROUND OF THE INVENTION

Exemplary embodiments of the present invention relate to a semiconductor integrated circuit (IC), and more particularly, to an output driving circuit of a semiconductor memory device.

As the operating speed of semiconductor memory devices has increased, the swing width of signals transmitted/received between the semiconductor memory devices has gradually decreased to transmit/receive signals at a high speed. However, as the swing width of a signal is decreased, an external noise on the transmitted/received signal becomes more significant.

As the swing width of a signal is decreased, a signal reflection due to impedance mismatching at an interface terminal of a semiconductor memory device also increases. The impedance mismatching may be caused by external noise, a variation of a power supply voltage, a change in an operating temperature, a change in a manufacturing process, etc. When semiconductor memory devices communicate data with one another, impedance mismatching caused at input/output terminals makes it difficult to transmit the data at a high speed. In addition, output data outputted from a data output terminal of the semiconductor memory device may be distorted. Accordingly, when a receiving-side semiconductor memory device receives a distorted output signal, concerns regarding a setup/hold failure, an error in decision of an input level or the like may arise.

SUMMARY OF THE INVENTION

An embodiment of the present invention is directed to a semiconductor memory device which includes an output driver capable of actively coping with process, voltage, and temperature (PVT) variations, thereby having an enhanced impedance matching function.

In accordance with an embodiment of the present invention, a semiconductor memory device includes: a pad; an impedance calibration circuit configured to provide a first code value corresponding to an impedance value coupled to the pad; a PVT sensing control circuit configured to provide a second code value corresponding to a PVT variation; and an output driver configured to receive data and to pull up or pull down the pad to a driving power in response to the first code value and second code value.

DESCRIPTION OF SPECIFIC EMBODIMENTS

Figure 1:
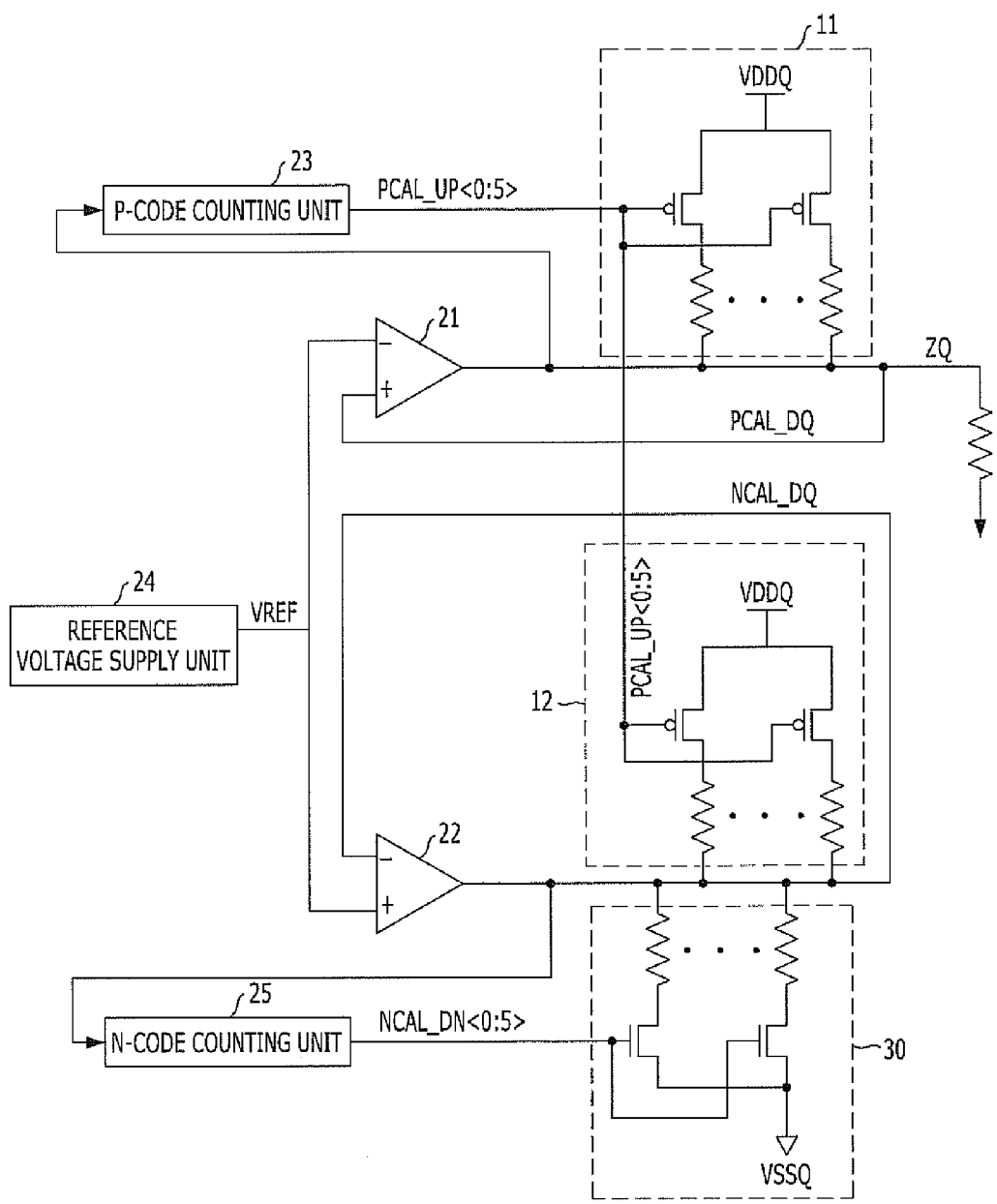
FIG. 1 is a circuit diagram illustrating an impedance calibration circuit included in an output driver of a semiconductor memory device according to an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

An embodiment of the present invention relates to a semiconductor integrated circuit (IC), which may have an impedance controller included in a data output driver. Especially, according to an embodiment of the present invention, a sensing control apparatus for coping with process, voltage, and temperature (PVT) variations is inserted into a data output driver, thereby enhancing the driving capability of the output driver and the signal integrity.

FIG. 1 is a circuit diagram illustrating an impedance calibration circuit included in an output driver of a semiconductor memory device according to an embodiment of the present invention.

Referring to FIG. 1, an output driver includes a reference voltage supply unit 24, a pull-up feedback unit 11, a pull-up detecting unit 21, a P-code counting unit 23, a pull-down feedback unit 12, a pull-down detecting unit 22, an N-code counting unit 25, and a pull-down resistance unit 30. The reference voltage supply unit 24 supplies a reference voltage VREF. The pull-up feedback unit 11, in response to a pull-up code signal PCAL_UP<0:5> that corresponds to a calibrated input resistor ZQ, as a pull-up termination resistance voltage PCAL_DQ. The pull-up detecting unit 21 detects and outputs an output corresponding to a voltage level difference between the reference voltage VREF and the pull-up termination resistance voltage PCAL_DQ. The P-code counting unit 23 up-counts or down-counts the pull-up code signal PCAL_UP<0:5> in response to an output signal of the pull-up detecting unit 21. The pull-down feedback unit 12 receives the pull-up code signal PCAL_UP<0:5>, and adjusts a resistance value corresponding to the received pull-up code signal PCAL_UP<0:5> to generate a pull-down termination resistance voltage NCAL_DQ. The pull-down detecting unit 22 detects and outputs an output corresponding to a voltage level difference between the reference voltage VREF and the pull-down termination resistance voltage NCAL_DQ. The N-code counting unit 25 up-counts or down-counts the pull-up code signal PCAL_UP<0:5> in response to an output signal of the pull-down detecting unit 22. The pull-down resistance unit 30 maintains an output resistance value corresponding to the pull-up code signal PCAL_UP<0:5>.

The input resistor ZQ is a resistor coupled to an external input pin. For example, the input resistor ZQ may be a resistor of 240 ohms coupled between the input pin and the ground voltage.

Figure 2:
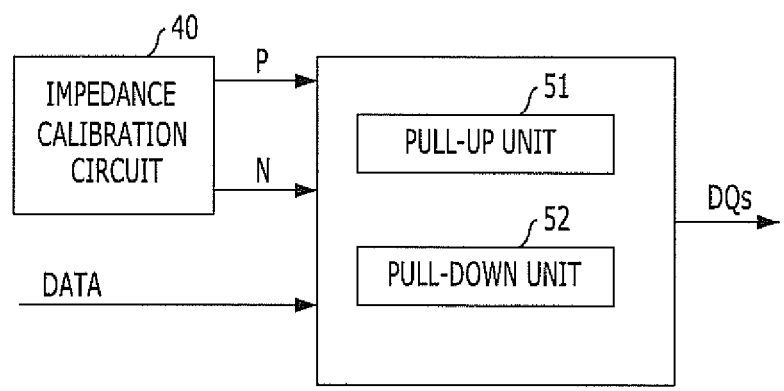
FIG. 2 is a block diagram illustrating a typical output driver of a semiconductor memory device.

FIG. 2 is a block diagram illustrating a typical output driver of a semiconductor memory device.

Referring to FIG. 2, the output driver of the semiconductor memory device includes an impedance calibration circuit 40, a pull-up unit 51, and a pull-down unit 52. A pull-up code P and a pull-down code N, which are outputted from the impedance calibration circuit 40, represent the pull-up code signal PCAL_UP<0:5> and the pull-up code signal PCAL_UP<0:5>, respectively, of FIG. 1.

An impedance calibration operation of a semiconductor memory device and an operation of the output driver will be described with reference to FIGS. 1 and 2.

First, the pull-up feedback unit 11, in response to a pull-up code signal PCAL_UP<0:5> that corresponds to an input resistor ZQ, outputs a pull-up termination resistance voltage PCAL_DQ. Next, the pull-up detecting unit 21 detects a voltage level difference between the reference voltage VREF and the pull-up termination resistance voltage PCAL_DQ, and outputs an output signal corresponding to a detected value. Then, the P-code counting unit 23 performs a counting operation according to the output signal of the pull-up detecting unit 21. The current pull-up code signal PCAL_UP<0:5> is down-counted when the output signal of the pull-up detecting unit 21 has a logic level of "H," and the current pull-up code signal PCAL_UP<0:5> is up-counted when the output signal of the pull-up detecting unit 21 has a logic level of "L," thereby generating a new pull-up code signal PCAL_UP<0:5>.

Such a process is continuously performed until the pull-up termination resistance voltage PCAL_DQ has a voltage level corresponding to the reference voltage VREF. When the pull-up termination resistance voltage PCAL_DQ has a voltage level corresponding to the reference voltage VREF, the resistance value of a termination resistance corresponding to a relevant pull-up code signal PCAL_UP<0:5> is the same as that of the input resistor ZQ.

Then, the pull-down feedback unit 12 outputs a pull-down termination resistance voltage NCAL_DQ corresponding to the pull-up code signal PCAL_UP<0:5>.

Next, the pull-down detecting unit 22 detects and outputs an output corresponding to a voltage level difference between the reference voltage VREF and the pull-down termination resistance voltage NCAL_DQ. Also, in this case, the N-code counting unit 25 down-counts the current pull-up code signal PCAL_UP<0:5> in response to a logic level of "H" from the pull-down detecting unit 22, and up-counts the current pull-up code signal PCAL_UP<0:5> in response to a logic level of "L" from the pull-down detecting unit 22, thereby generating a new pull-up code signal PCAL_UP<0:5>.

The reference voltage VREF is set to, for example, one-half of a power supply voltage, and the aforementioned process is repeated until the pull-up termination resistance voltage PCAL_DQ and pull-down termination resistance voltage NCAL_DQ become ½ VDDQ.

The aforementioned process is called a ZQ calibration, which is performed to calibrate the impedance of the output driver of the semiconductor memory device to a desired value.

The impedance calibration circuit 40 outputs finally-calibrated pull-up code P and pull-down code N to the pull-up unit 51 and pull-down unit 52, respectively. The pull-up unit 51 calibrates an output terminal impedance according to the pull-up code P. The pull-down unit 52 calibrates the impedance of the output terminal according to the pull-down code N.

The output driver illustrated in FIG. 2 receives a data signal DATA transferred from the interior of the semiconductor memory device, and outputs output data DQs. The pull-up unit 51 operates when the output data DQs is in a high level, and the pull-down unit 52 operates when the output data DQs is in a low level.

However, when the semiconductor memory device operates, the operating state of the output driver may change due to a PVT variation. Here, the PVT represents the states of process, voltage, and temperature, and may vary and influence characteristics of the semiconductor memory device such as transistors therein.

The output driver illustrated in FIG. 2 may be subject to a PVT variation.

In addressing such a concern, an embodiment of the present invention proposes an output driver structure which minimizes/reduces the influence of a PVT variation, in addition to performing the ZQ calibration operation. A PVT sensing apparatus according to an embodiment of the present invention enables a reduction of distortion in the operation of the output driver, which is caused by a PVT variation.

Figure 3:
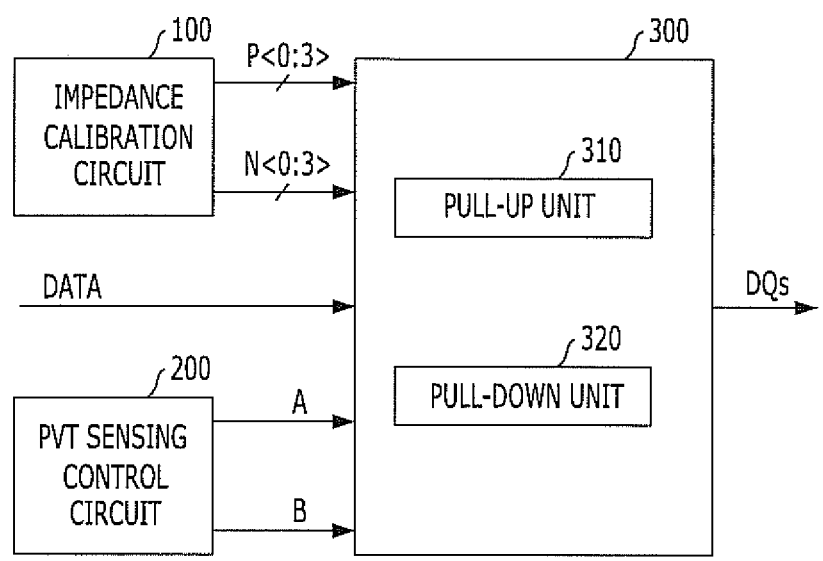
FIG. 3 is a block diagram illustrating the configuration of a semiconductor memory device according to an embodiment of the present invention.

FIG. 3 is a block diagram illustrating the configuration of a semiconductor memory device according to an embodiment of the present invention.

Referring to FIG. 3, the semiconductor memory device according to this embodiment includes an impedance calibration circuit 100, a PVT sensing control circuit 200, a pull-up unit 310, and a pull-down unit 320. The pull-up unit 310 and pull-down unit 320 constitute a data output section 300.

The impedance calibration circuit 100 has a construction similar to that of the impedance calibration circuit illustrated in FIG. 1 and performs a ZQ calibration operation. The pull-up unit 310 receives a data signal DATA, and pulls up the output terminal to output high-level output data DQs. The pull-down unit 320 receives a data signal DATA, and pulls down the output terminal to output low-level output data DQs. The PVT sensing control circuit 200 generates and outputs control signals A and B to the pull-up unit 310 and pull-down unit 320. Here, although two control signals A and B are shown, a larger number of control signals may be generated.

Figure 4:
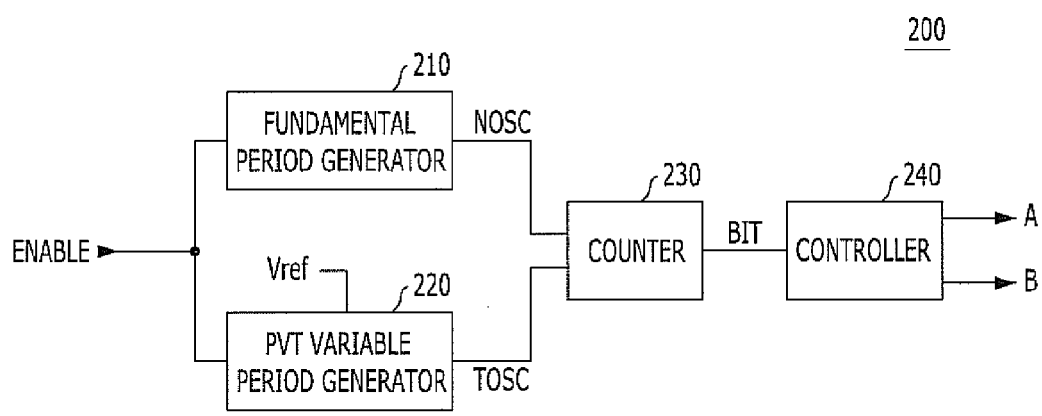
FIG. 4 is a block diagram illustrating the configuration of the PVT sensing control circuit illustrated in FIG. 3.

FIG. 4 is a block diagram illustrating the configuration of the PVT sensing control circuit illustrated in FIG. 3.

Referring to FIG. 4, the PVT sensing control circuit includes a fundamental period generator 210, a PVT variable period generator 220, a counter 230, and a controller 240.

The fundamental period generator 210 and the PVT variable period generator 220 are enabled in response to an enable signal ENABLE. The fundamental period generator 210 outputs a first period signal Nosc which has a constant period regardless of PVT variation. The PVT variable period generator 220 generates a second period signal Tosc, which is sensitive to a PVT variation and has a period varying based on a PVT variation. The counter 230 counts the number of periods of the first period signal Nosc that occur during one period of the second period signal Tosc. The controller 240 generates and outputs a control signal A or B corresponding to a counted value outputted from the counter 230. Thus, the data output section 300 calibrates the impedance, thereby reducing distortion of an output signal. For example, a control operation may be performed in such a manner as to enable the control signal A at a temperature of 50 degrees and to enable the control signal B at a temperature of 90 degrees.

Figure 5:
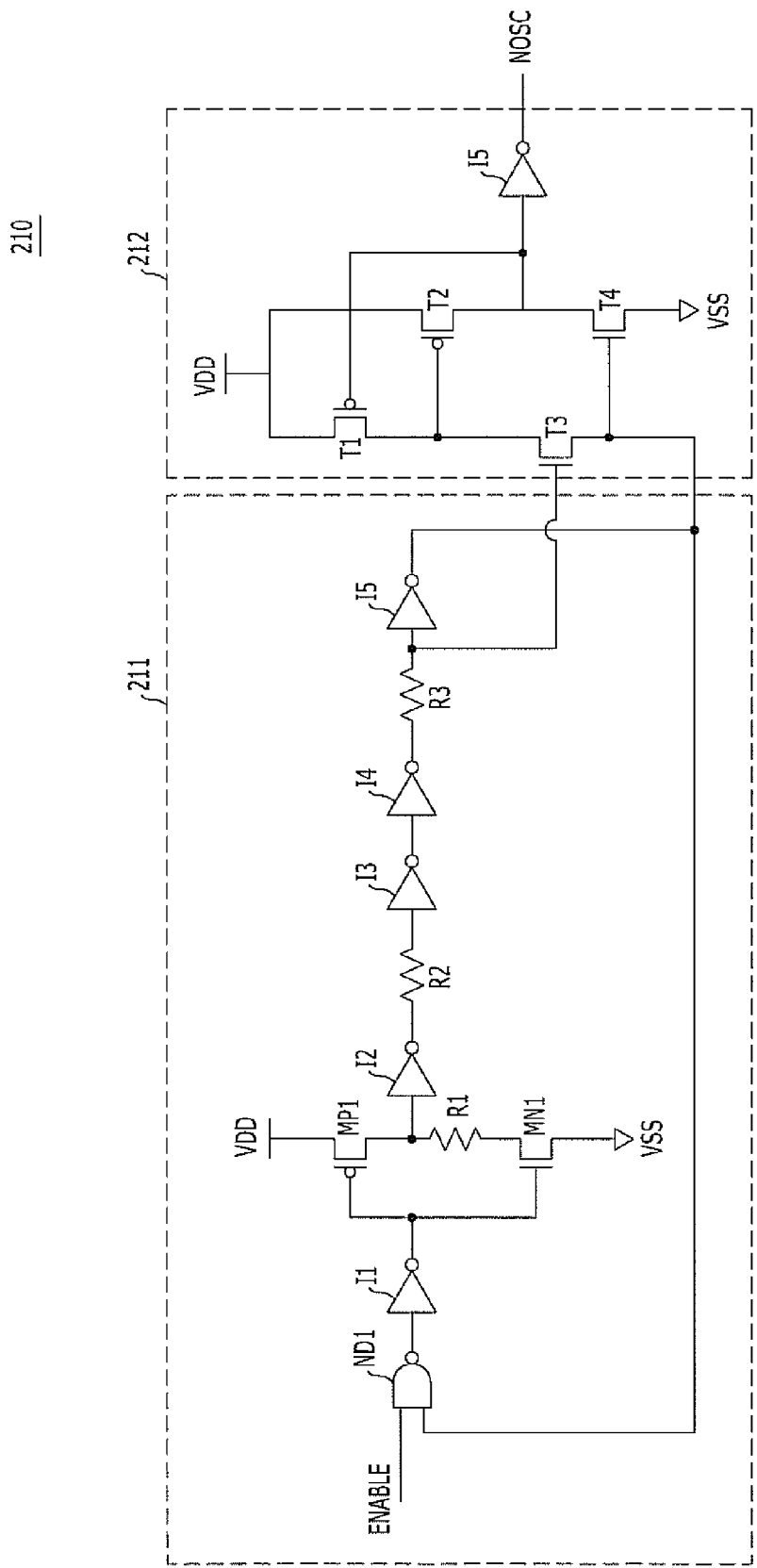
FIG. 5 is a circuit diagram illustrating the configuration of the fundamental period generator illustrated in FIG. 4.

FIG. 5 is a circuit diagram illustrating the configuration of the fundamental period generator 210 of FIG. 4.

Referring to FIG. 5, the fundamental period generator includes an oscillating module 211 and a first period signal output module 212. The oscillating module 211 includes a NAND gate ND1, inverters I1 to I5, resistors R1 to R3, and MOS transistors MP1 and MN1, thereby generating an oscillation signal in response to an enable signal ENABLE. The first period signal output module 212 includes MOS transistors T1 to T4 and an inverter I6, thereby outputs the first period signal Nosc. The first period signal Nosc has a pulse width which does not vary significantly with respect to a PVT variation.

Figure 6:
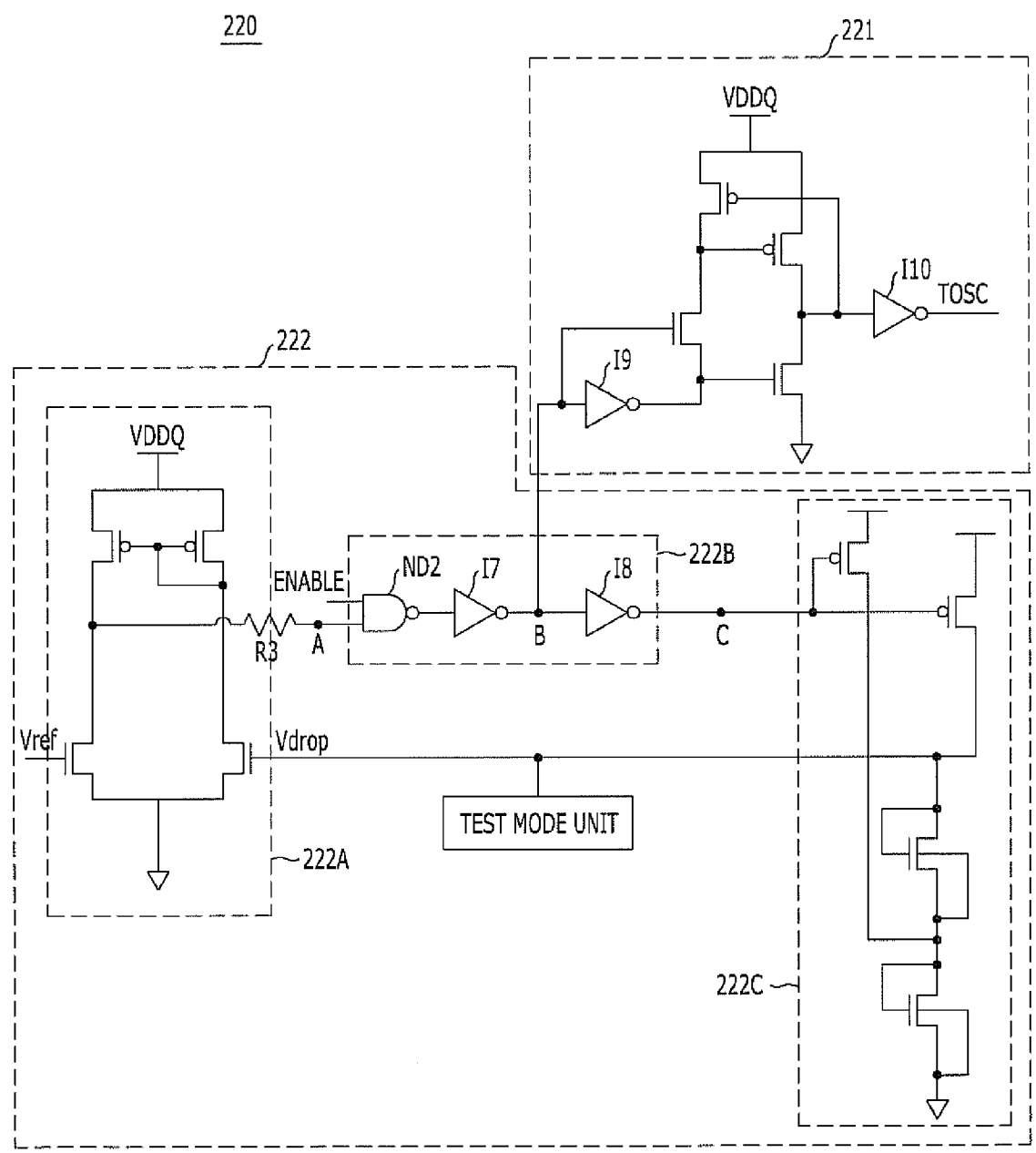
FIG. 6 is a circuit diagram illustrating the configuration of the PVT variable period generator illustrated in FIG. 4.

FIG. 6 is a circuit diagram illustrating the configuration of the PVT variable period generator 220 of FIG. 4.

Referring to FIG. 6, the PVT variable period generator 220 includes a signal generation module 222 and a second period signal output module 221.

The signal generation module 222 receives a reference voltage Vref, and generates a second signal B, which has a pulse width varying sensitively (e.g., extensively) in response to a PVT variation.

The signal generation module 222 is enable when a first voltage Vdrop reflected the detected PVT variation with has a value smaller than a reference voltage Vref. The signal generation module 222 includes a voltage comparison unit 222A, a second period signal driving unit 222B and a PVT detection unit 222C.

The voltage comparison unit 222A compares a first voltage Vdrop with the reference voltage Vref and output a first signal A in accordance with a comparison result of the first voltage Vdrop and the reference voltage Vref.

The second period signal driving unit 222B outputs the first signal A as the second signal B and outputs the second signal B as a third signal C when the enable signal ENABLE is activated.

The PVT detection unit 222C outputs the first voltage Vdrop to the signal generation module 222 by detecting the PVT variation. The PVT detection unit 222C includes MOS transistor PM1 and PM2 and capacitors CAP1 and CAP2. The MOS transistor PM1 and PM2 are configured to be turned on/off in response to the third signal C and charge/discharge capacitance of the capacitors CAP1 and CAP2 by supplying VDDQ and ground voltage. The capacitors CAP1 and CAP2 are charged/discharged by on/off of the MOS transistor PM1 and PM2. Voltage level of the first voltage Vdrop is determined by capacitance of the capacitors CAP1 and CAP2.

The second period signal output module 221 outputs a second period signal Tosc through the use of the second signal B provided from the signal generation module 222.

The second period signal Tosc has a period with a pulse width that varies sensitively in response to a PVT variation (for example, more sensitively and extensively than the first period signal Nosc).

A test mode unit is used to provide a value for a test in a test mode.

Figure 7:
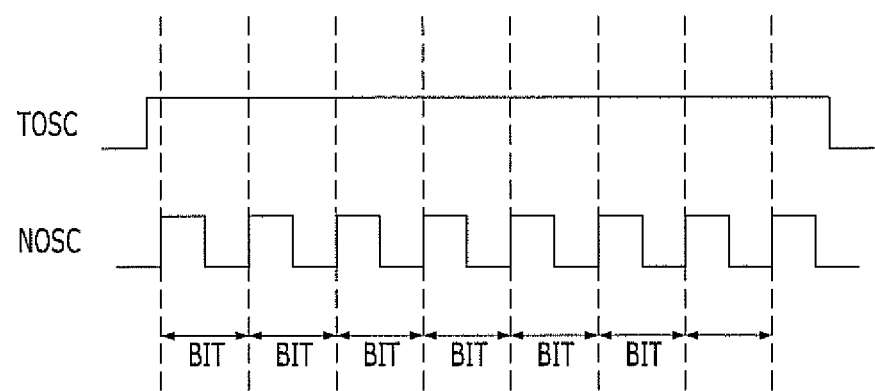
FIG. 7 is a waveform view illustrating output waveforms of the circuits illustrated in FIGS. 5 and 6.

FIG. 7 is a waveform view illustrating output waveforms of the circuits illustrated in FIGS. 5 and 6.

Referring to FIG. 7, when a first period signal Nosc having a desired width is generated, the counter 230 counts the number of the second period signals Tosc that occur during one period of the first period signal Nosc. Based on the value counted by the counter 230, a control signal A or B is generated.

Figure 8:
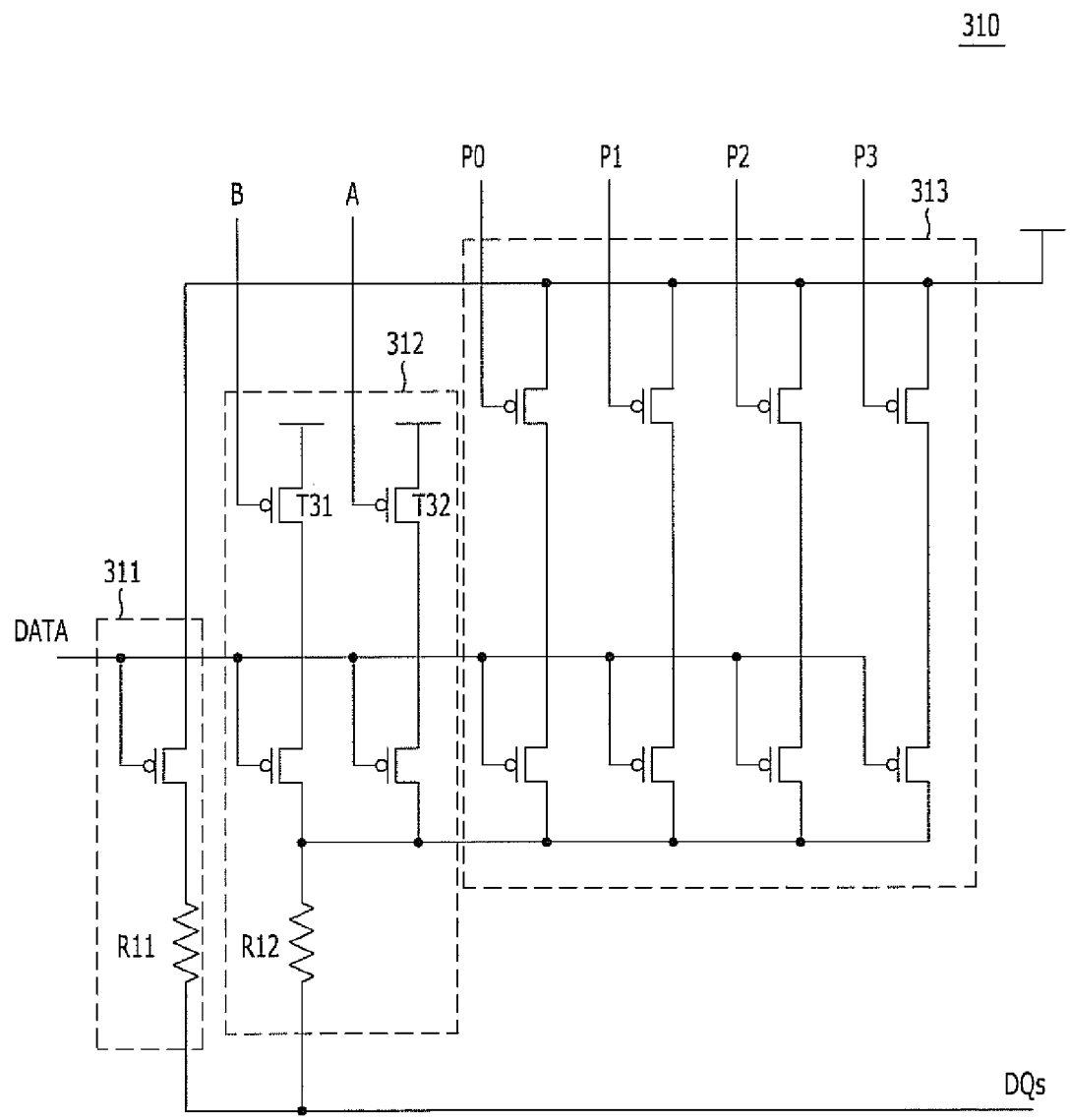
FIG. 8 is a circuit diagram illustrating the configuration of the pull-up unit illustrated in FIG. 3.
Figure 9:
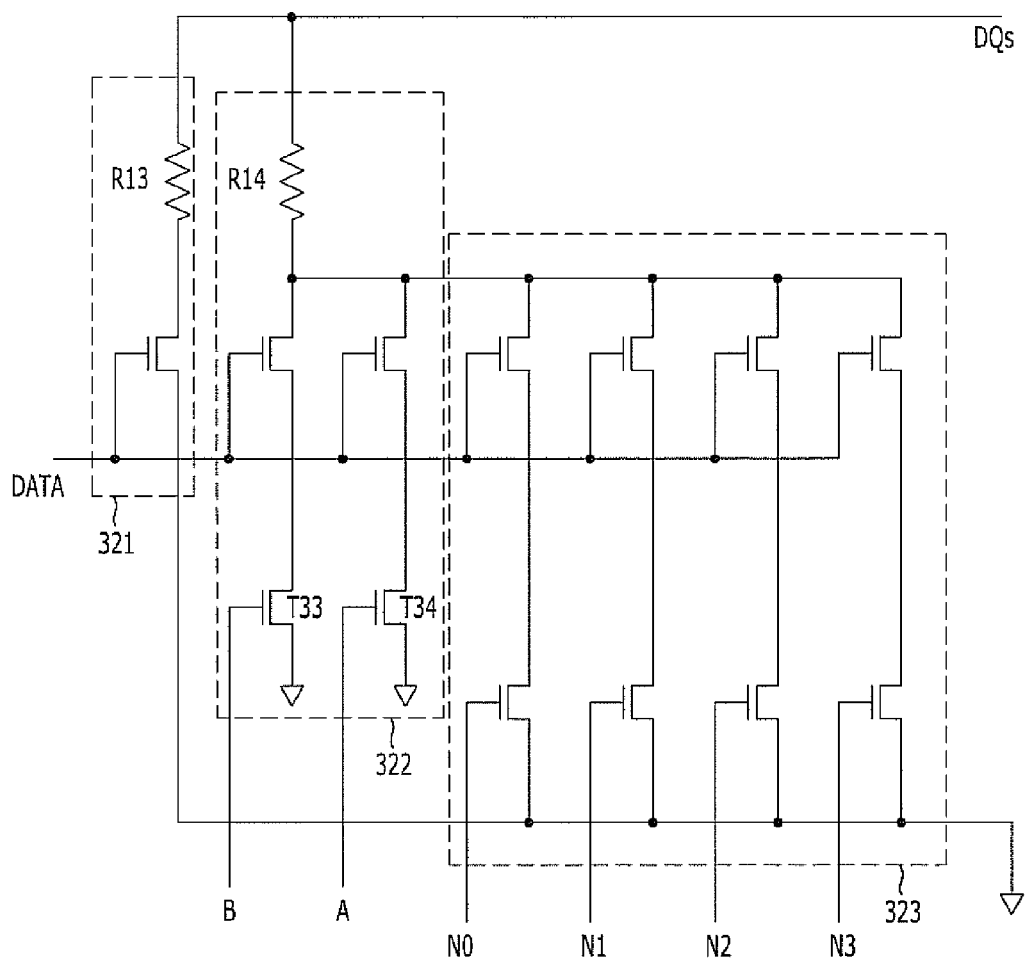
FIG. 9 is a circuit diagram illustrating the configuration of the pull-down unit illustrated in FIG. 3.

FIG. 8 is a circuit diagram illustrating the configuration of the pull-up unit 310 of FIG. 3, and FIG. 9 is a circuit diagram illustrating the configuration of the pull-down unit 320 of FIG. 3.

Referring to FIG. 8, the pull-up unit 310 includes a first pull-up driver 311, a second pull-up driver 312, and a third pull-up driver 313 for receiving data and outputting a pull-up signal. The first pull-up driver 311 receives data and provides a pull-up signal pulling up a pad DQs. The second pull-up driver 312 receives data and provides a pull-up signal pulling up the pad DQs depending on the control signals A and B. Thus, MOS transistors T31 and T32 are turned on to enable a connection to a power supply voltage according to the control signals A and B, so that a pull-up signal pulling up the pad DQs in response to the MOS transistors T31 and T32 can be provided. The third pull-up driver 313 receives a code value P0 to P3 resulting from the calibration explained with reference to FIG. 1, and MOS transistors included in the third pull-up driver 313, corresponding to the code value, are turned on depending on the code value. Then, a pull-up signal corresponding to the turned-on MOS transistors is provided to the pad DQs.

Referring to FIG. 9, the pull-down unit 320 includes a first pull-down driver 321, a second pull-down driver 322, and a third pull-down driver 323 for receiving data and outputting a pull-down signal. The first pull-down driver 321 receives data and provides a pull-down signal pulling down a pad DQs. The second pull-down driver 322 receives data and provides a pull-down signal pulling down the pad DQs depending on the control signals A and B. Thus, MOS transistors T33 and T34 are turned on to enable a connection to a ground supply voltage according to the control signals A and B, so that a pull-down signal pulling down the pad DQs in response to the MOS transistors T33 and T34 can be provided. The third pull-down driver 323 receives a code value N0 to N3 resulting from the calibration explained with reference to FIG. 1, and MOS transistors included in the third pull-down driver 323, corresponding to the code value, are turned on depending on the code value. Then, a pull-down signal corresponding to the turned-on MOS transistors is provided to the pad DQs.

According to an embodiment of the present invention, the pull-up unit and pull-down unit of the semiconductor memory device are configured to calibrate the impedance of an output terminal according to a code value resulting from a ZQ calibration operation, and additionally, a fine calibration of an impedance according to control signals A and B may be performed. Thus, according to an exemplary embodiment, the semiconductor memory device additionally receives a PVT sensing control signal while performing a ZQ calibration operation, and calibrates the impedance value distorted by a PVT variation, thereby enabling data to be transmitted at a high speed and preventing data distortion.

According to an embodiment of the present invention, the semiconductor memory device includes not only a part capable of receiving an internal signal and calibrating the impedance of an output terminal through transistors of the output driver, but also, additionally, a part capable of receiving a PVT sensing control signal and finely calibrating the impedance of the output terminal in the output driver. Thus, a calibration of the impedance value of the output terminal of the output driver, which has been distorted by a PVT variation, may be performed. Accordingly, the semiconductor memory device can reliably output data at a high speed, and prevent distortion of output data.

While the present invention has been described with respect to the specific embodiments, it will be apparent to those skilled in the art that various changes and modifications may be made without departing from the spirit and scope of the invention as defined in the following claims. Therefore, the spirit and scope of the present invention must be defined not by described embodiments thereof but by the appended claims and equivalents of the appended claims.

What is claimed is:

1. A semiconductor memory device comprising:
   a pad;
   an impedance calibration circuit configured to provide a first code value corresponding to an impedance value coupled to the pad;
   a process, voltage and temperature (PVT) sensing control circuit configured to provide a second code value corresponding to a PVT variation, wherein the PVT sensing control circuit is separate from the impedance calibration circuit; and
   an output driver configured to receive data, the first code value and the second code value and to pull up or pull down the pad in response to the first code value and the second code value.

2. The semiconductor memory device of claim 1, wherein the output driver comprises:
   a pull-down unit configured to pull down the pad; and
   a pull-up unit configured to pull up the pad.

3. The semiconductor memory device of claim 2, wherein the pull-up unit comprises:
   a first pull-up driver configured to receive the data and to pull up the pad to a first supply voltage;
   a second pull-up driver configured to receive the first code value and to pull up the pad to a second supply voltage; and
   a third pull-up driver configured to receive the second code value and to pull up the pad to a third supply voltage.

4. The semiconductor memory device of claim 2, wherein the pull-down unit comprises:
   a first pull-down driver configured to receive the data and to pull down the pad to a first supply voltage;
   a second pull-down driver configured to receive the first code value and to pull down the pad to a second supply voltage; and
   a third pull-down driver configured to receive the second code value and to pull down the pad to a third supply voltage.

5. The semiconductor memory device of claim 3, wherein the first pull-up driver comprises a first MOS transistor configured to receive the data through a gate terminal thereof and to pull up the pad.

6. The semiconductor memory device of claim 5, wherein the second pull-up driver comprises:
   a second MOS transistor configured to receive the data through a gate terminal thereof and to pull up the pad; and
   a third MOS transistor coupled in series with the second MOS transistor so as to receive the first code value through a gate terminal of the third MOS transistor and to transfer a pull-up voltage to the pad through the second MOS transistor.

7. The semiconductor memory device of claim 6, wherein the third pull-up driver comprises:
   a fourth MOS transistor configured to receive the data through a gate terminal thereof and to pull up the pad; and
   a fifth MOS transistor coupled in series with the fourth MOS transistor so as to receive the second code value through a gate terminal of the fifth MOS transistor and to transfer a pull-up voltage to the pad through the fourth MOS transistor.

8. The semiconductor memory device of claim 1, wherein the PVT sensing control circuit comprises:
   a fundamental period generator configured to generate a first period signal;
   a PVT variable period generator configured to generate a second period signal which has a period varying more sensitively to a PVT variation than the period of the first period signal;
   a counter configured to count the number of periods of the first period signal that occur during one period of the second period signal; and
   a controller configured to generate the second code value corresponding to a value counted by the counter.

9. The semiconductor memory device of claim 8, wherein the PVT variable period generator comprises:
   a signal generation module configured to generate a signal reflected a detected PVT variation by detecting the PVT variation; and
   a second period signal output module configured to output the signal as the second period signal.

10. The semiconductor memory device of claim 9, wherein the signal generation module is enable when a first voltage reflected the detected PVT variation with has a value smaller than a reference voltage.

11. The semiconductor memory device of claim 10, wherein the signal generation module comprises:
    a voltage comparison unit configured to compare the first voltage with the reference voltage and output a first signal in accordance with a comparison result;
    a second period signal driving unit configured to output the first signal as a second signal and output the second signal as a third signal when enable signal is activated; and
    a PVT detection unit configured to output the first voltage to the signal generation module by detecting the PVT variation.

12. The semiconductor memory device of claim 4, wherein the first pull-down driver comprises a sixth MOS transistor configured to receive the data through a gate terminal thereof and to pull up the data.

13. The semiconductor memory device of claim 12, wherein the second pull-down driver comprises:
    a seventh MOS transistor configured to receive the data through a gate terminal thereof and to pull down the pad; and
    a eighth MOS transistor coupled in series with the seventh MOS transistor so as to receive the first code value through a gate terminal of the eighth MOS transistor and to transfer a pull-down voltage to the pad through the eighth MOS transistor.

14. The semiconductor memory device of claim 13, wherein the third pull-down driver comprises:
    a ninth MOS transistor configured to receive the data through a gate terminal thereof and to pull down the pad; and
    a tenth MOS transistor coupled in series with the ninth MOS transistor so as to receive a third code value through a gate terminal of the tenth MOS transistor and to transfer a pull-down voltage to the pad through the tenth MOS transistor.

* * * * *